(12) United States Patent
Colombeau et al.

(10) Patent No.: US 11,189,479 B2
(45) Date of Patent: Nov. 30, 2021

(54) DIFFUSION BARRIER LAYER

(71) Applicant: Applied Materials, Inc., Santa Clara, CA (US)

(72) Inventors: Benjamin Colombeau, San Jose, CA (US); Johanes F. Swenberg, Los Gatos, CA (US); Steven C. H. Hung, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/865,514

(22) Filed: May 4, 2020

(65) Prior Publication Data
US 2020/0357629 A1 Nov. 12, 2020

Related U.S. Application Data

(60) Provisional application No. 62/843,802, filed on May 6, 2019.

(51) Int. Cl.
| | | |
|---|---|---|
| H01L 21/469 | (2006.01) | |
| H01L 23/58 | (2006.01) | |
| H01L 21/02 | (2006.01) | |
| H01L 21/762 | (2006.01) | |
| H01L 21/768 | (2006.01) | |

(52) U.S. Cl.
CPC .. H01L 21/02002 (2013.01); H01L 21/76202 (2013.01); H01L 21/76841 (2013.01)

(58) Field of Classification Search
CPC .................................................. H01L 21/76841
USPC .......... 257/640, 649, 751; 438/653, 785–791
See application file for complete search history.

(56) References Cited

U.S. PATENT DOCUMENTS

| | | | | |
|---|---|---|---|---|
| 6,962,845 B2 * | 11/2005 | Lee | .......................... | H01L 28/65 |
| | | | | 438/240 |
| 8,254,175 B2 * | 8/2012 | Higuchi | ............ | H01L 29/40117 |
| | | | | 365/185.18 |
| 10,276,399 B2 * | 4/2019 | Hou | ...................... | H01L 29/4975 |
| 10,763,166 B2 * | 9/2020 | Briggs | .................. | H01L 21/321 |
| 2009/0200635 A1 * | 8/2009 | Koldiaev | .......... | H01L 21/32139 |
| | | | | 257/506 |

\* cited by examiner

*Primary Examiner* — Calvin Lee
(74) *Attorney, Agent, or Firm* — Servilla Whitney LLC

(57) ABSTRACT

A method of forming an electronic device is disclosed. The method comprises forming a barrier layer on a silicon layer, and depositing a silicon oxide layer on the barrier layer. The formation of the barrier layer on the silicon layer minimizes parasitic oxidation of the underlying silicon layer and minimizes defects in the silicon layer.

13 Claims, 3 Drawing Sheets

DIFFUSION BARRIER LAYER

CROSS-REFERENCE TO RELATED APPLICATIONS

This application claims priority to U.S. Provisional Application No. 62/843,802, filed May 6, 2019, the entire disclosure of which is hereby incorporated by reference herein.

TECHNICAL FIELD

Embodiments of the present disclosure generally relate to methods of forming silicon barrier layers.

BACKGROUND

In the manufacture of electronic devices such as integrated circuits, a target substrate, such as a semiconductor wafer, is subjected to various processes, such as film formation, etching, oxidation, diffusion, reformation, annealing, and natural oxide film removal. Silicon-containing films are an important part of many of these processes.

Silicon oxide and silicon nitride films have very good oxidation resistance and dielectric qualities. Accordingly, these films have been used in many applications, including oxide/nitride/oxide stacks, etch stops, oxygen diffusion barriers, and gate insulation layers, among others. As circuit geometries shrink to smaller feature sizes, thinner films with better coverage on high aspect ratio structures are required. As device technology advances, metallization schemes also are more sophisticated and require lower thermal stresses. Therefore, better quality silicon oxide films are desired.

The manufacturing of replacement metal gates often requires the presence of a silicon layer on a substrate surface to act as an etch stop. The etch process removes the dummy gates and any silicon oxide (e.g., $SiO_2$) formed on the silicon layer. Accordingly, it is imperative to effectively control any oxidation of the silicon layer including any parasitic oxidation from other processes or the atmosphere.

Many current processes for controlling the oxidation of the silicon layer involve depositing a silicon oxide layer on the silicon layer to prevent oxidation of the underlying silicon layer. One process comprises the atomic layer deposition of $SiO_2$ on the silicon layer. Unfortunately, this process often oxidizes the underlying silicon layer while forming the $SiO_2$ layer, leading to defects to the interface.

Therefore, there is a need for methods of controlling the oxidation of a silicon layer.

SUMMARY

One or more embodiments of the disclosure are directed to a method of manufacturing an electronic device. In one or more embodiments, the method comprises forming a barrier layer on a silicon layer; and depositing a silicon oxide layer on the barrier layer.

One or more embodiments of the disclosure are directed to a method of manufacturing an electronic device. In one or more embodiments, the method comprises forming a high quality barrier layer on a conformal silicon layer on a surface of a substrate material having a three-dimensional feature formed thereon, the barrier layer comprising one or more of silicon oxide or silicon nitride and being formed by one or more of rapid thermal processing (RTP), decoupled plasma oxidation (DPO) or decoupled plasma nitridation (DPN), the high quality barrier layer having a first thickness; and depositing a second thickness of one or more of a silicon oxide layer or silicon nitride layer on the high quality barrier layer by atomic layer deposition (ALD), wherein the sum of the first thickness and the second thickness is less than or equal to about 30 Å.

One or more embodiments of the disclosure are directed to a processing tool. In one or more embodiments, the processing tool comprises a central transfer station comprising at least one robot configured to move a wafer; one or more of a rapid thermal processing (RTP) station, a decoupled plasma oxidation (DPO) or decoupled plasma nitridation (DPN) station connected to the central transfer station; an atomic layer deposition (ALD) station connected to the central transfer station; an optional pre-clean station connected to the central transfer station; and at least one controller connected to the one or more of the central transfer station, the RTP station, the DPO station, the DPN station, the ALD station or the optional pre-clean station, the at least one controller having at least one configuration selected from: a configuration to move the wafer between stations using the robot; a configuration to perform a rapid thermal process; a configuration to perform a decoupled plasma process; a configuration to control a flow of an oxidizing gas into the RTP station or DPO station; a configuration to control a flow of a nitriding gas into the RTP station or DPN station; a configuration to deposit a silicon oxide film by atomic layer deposition; and a configuration to pre-clean the wafer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the present disclosure relate to methods for forming an electronic device. Some methods of this disclosure advantageously provide methods for forming a barrier layer on a silicon layer. The formation of the barrier layer on the silicon layer advantageously minimizes parasitic oxidation of the underlying silicon layer and minimizes defects in the silicon layer. Some methods of this disclosure advantageously provide for forming a barrier layer resulting in reduced defects and improved electrical properties.

Figure 1:
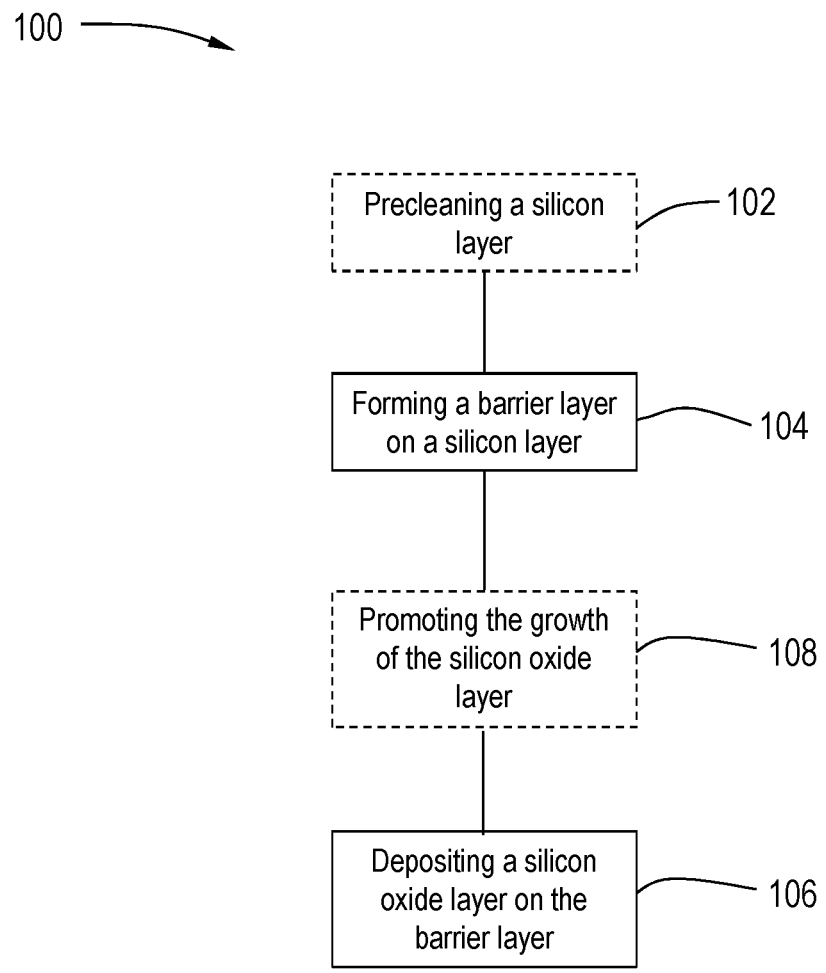
FIG. 1 is a flow chart of a method of forming an electronic device according to one or more embodiments of the disclosure.

Referring to FIG. 1, the method 100 of forming an electronic device begins at operation 104 by forming a barrier layer on a silicon layer. In one or more embodiments, the silicon layer is formed on a surface of a substrate material comprising one or more of silicon (Si), germanium (Ge), gallium (Ga), arsenic (As), indium (In), phosphorus (P), copper (Cu), selenium (Se), titanium (Ti), tantalum (Ta), or tungsten (W).

In some embodiments, optional operation 102 precedes the formation of the barrier layer. At operation 102, the surface of the substrate material is cleaned. In some embodiments, cleaning the surface of the substrate material comprises exposing the surface to a remote plasma etch process. In some embodiments, the remote plasma comprises plasma of one or more of $H_2$, $NF_3$ or $NH_3$. In some embodiments, cleaning the surface of the substrate material comprises a SiConi etch.

In some embodiments, the substrate material comprises germanium. In some embodiments, the substrate material comprises SiGe. In some embodiments, the substrate material comprises less than or equal to about 5%, less than or equal to about 10%, less than or equal to about 15%, less than or equal to about 20%, less than or equal to about 25%, or less than or equal to about 30% germanium on an atomic basis. In some embodiments, the substrate material comprises greater than or equal to about 2%, greater than or equal to about 5%, greater than or equal to about 10%, greater than or equal to about 15%, greater than or equal to about 20%, or greater than or equal to about 25% germanium on an atomic basis. In some embodiments, the substrate material comprises an atomic percentage of germanium in a range of about 2% to about 30%, in a range of about 5% to about 30%, in a range of about 10% to about 30%, in a range of about 15% to about 30%, in a range of about 20% to about 30%, or in a range of about 25% to about 30%.

In some embodiments, the silicon layer has a thickness of less than about 50 Å, less than about 40 Å, less than about 30 Å, or less than about 20 Å. In some embodiments, the silicon layer has a thickness in a range of about 10 Å to about 50 Å, in a range of about 20 Å to about 50 Å, in a range of about 30 Å to about 50 Å, in a range of about 40 Å to about 50 Å, in a range of about 10 Å to about 40 Å, in a range of about 20 Å to about 40 Å, in a range of about 30 Å to about 40 Å, in a range of about 10 Å to about 30 Å, in a range of about 20 Å to about 30 Å, or in a range of about 10 Å to about 20 Å.

In some embodiments, the surface has a feature formed thereon. In some embodiments, the surface has a three dimensional feature formed thereon. In some embodiments, the silicon layer is substantially conformal to the surface of the substrate material. In some embodiments, the barrier layer is substantially conformal to the surface of the substrate material.

As used herein, a layer which is "substantially conformal" refers to a layer where the thickness is about the same throughout (e.g., on the top, middle and bottom of sidewalls and on the bottom of the gap). A layer which is substantially conformal varies in thickness by less than or equal to about 10%, 5%, 2%, 1% or 0.5%.

Without intending to be bound by theory, it is thought that the interface of the barrier layer and the underlying silicon layer is superior, as defined by lower defect density (DIT), when compared to an electronic device that does not have a barrier layer. In one or more embodiments, when the barrier layer is formed on the underlying silicon layer, the silicon layer is unchanged other than the portion that is consumer forming the barrier layer. In one or more embodiments, forming the barrier layer consumes about 1 Å of silicon layer for every 2 Å of barrier layer formed. For example, if 10 Å of barrier layer is formed, less than or equal to about 5 Å of silicon layer is consumed. If 20 Å of barrier is formed, less than or equal to about 10 Å of silicon layer is consumed.

In one or more embodiments, the barrier layer has a thickness in a range of about 10 Å to about 25 Å, including about 10 Å, about 15 Å, about 20 Å, and about 25 Å

In one or more embodiments, the barrier layer comprises one or more of silicon oxide or silicon oxynitride. In one or more embodiments, the barrier layer is formed by oxidizing the underlying silicon layer to form a high quality silicon oxide ($SiO_2$) layer. As used herein, the term "high quality silicon oxide ($SiO_2$) layer" refers to a layer having a high density, more ordered bonding, and reduced electrical device leakage. In one or more embodiments, the physical density, as measured by the wet etch rate (a lower wet etch rate (WER) means a higher density) is higher. In one or more embodiments, the bonding is more ordered, as determined by x-ray photoelectron spectroscopy (XPS) full width at half maximum (FWHM). As used herein, the term "full width at half maximum (FWHM)" refers to a full width of a peak (spectroscopic peak) measured at a half of its maximum height.

In one or more embodiments, forming the barrier layer comprises one or more of thermal oxidation, thermal nitridation, plasma oxidation, or plasma nitridation. In some embodiments, forming the barrier layer comprises one or more of rapid thermal processing (RTP) in an oxidizing environment, RTP in a nitriding environment, decoupled plasma oxidation (DPO), or decoupled plasma nitridation (DPN).

At operation 106, a silicon oxide layer is deposited on the barrier layer. In one or more embodiments, the silicon oxide layer is deposited using an atomic layer deposition (ALD) process.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In one or more embodiments, the combined thickness of the barrier layer and the deposited silicon oxide layer is less than or equal to about 25 Å.

At operation 108, in one or more embodiments, the growth of the silicon oxide layer is promoted after forming the barrier layer and prior to depositing the silicon oxide layer by ALD. Without intending to be bound by theory, it is thought that promoting the growth of the silicon oxide layer may be accomplished by nucleation on thermal silicon oxide ($SiO_2$) (initial seeding of ALD layer to be 2D versus 3D) by using a hydroxylation process. In one or more embodiments, make and form specific bonds or chemicals on the surface of the barrier layer to promote ALD since the barrier layer formed is very stable.

In one or more embodiments, the silicon oxide layer further comprises silicon nitride.

Figure 2:
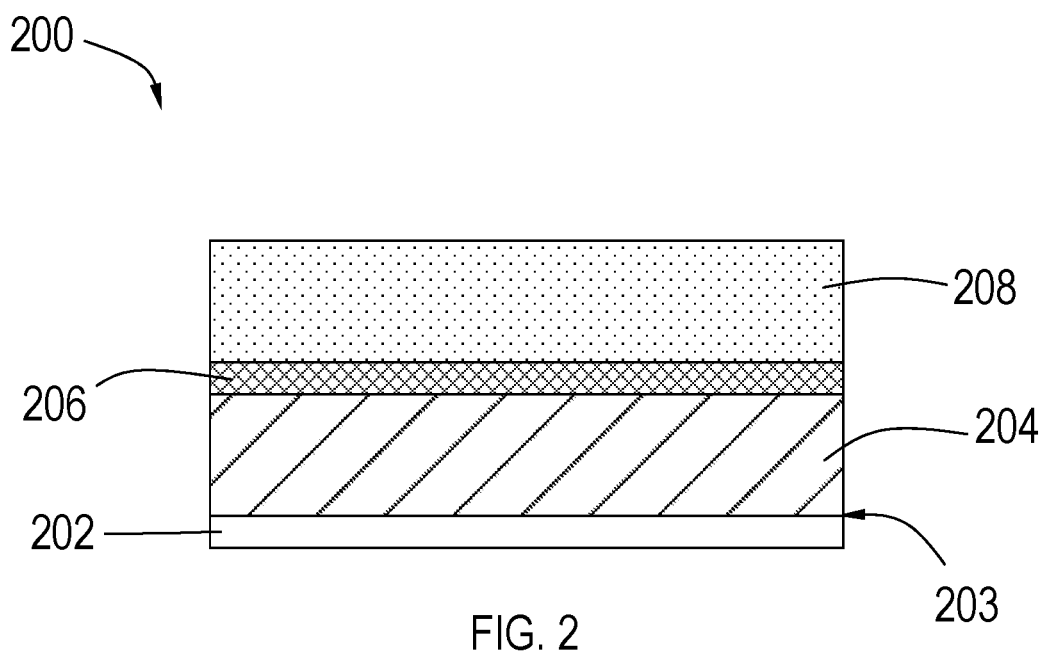
FIG. 2 illustrates an exemplary electronic device according to one or more embodiments of the disclosure.

FIG. 2 illustrates an exemplary electronic device 200 comprising a substrate material 202 and a substrate surface 203. In some embodiments, the substrate material 202 may comprise one or more of silicon (Si), germanium (Ge), gallium (Ga), arsenic (As), indium (In), phosphorus (P), copper (Cu), selenium (Se), titanium (Ti), tantalum (Ta), or tungsten (W). In some embodiments, the substrate material 202 comprises a metal, or a metal nitride, or a metal carbide.

In one or more embodiments, the substrate surface 203 may have a three dimensional feature formed thereon (not illustrated). In one or more embodiments, the three dimensional (3D) feature is be formed on the surface 203 of the substrate material 202 by various patterning and etching processes. Generally, the 3D features are formed with dimensions suitable for implementation as fin field-effect transistors (FinFETs) in complimentary metal-oxide semiconductor (CMOS) transistors, however, other transistor types may also benefit from the embodiments described herein. In some embodiments, the 3D features may be suitable for and may have dimensions commensurate for utilization in current technology nodes and advanced technology nodes, such as a sub-10 nm node or a 5 nm node.

In one or more embodiments, barrier layer 206 is formed on the surface 203 of substrate material 202. Subsequently, silicon oxide layer 208 is deposited on the barrier layer 206. In one or more embodiments, the deposited of silicon oxide layer 208 comprises an atomic layer deposition process.

Referring again to FIG. 1, at operation 104, the silicon layer 204 is treated at operation 106 to form a barrier layer 206. In some embodiments, the treatment of the silicon layer 204 forms a barrier layer 206 with reduced defects. In some embodiments, the treatment of the silicon layer 204 forms a barrier layer 206 with repaired bonds. In some embodiments, the treatment of the silicon layer 204 forms a barrier layer 206 with improved electrical properties.

As described above, operation 104 comprises one or more treatment processes. Exemplary treatment processes include, but are not limited to, thermal anneal processes like RTP, and plasma treatment processes like DPX. In some embodiments, treating the silicon layer comprises a RTP process and the temperature is in a range of about 550° C. to about 950° C., or in a range of about 700° C. to about 950° C., or about 800° C. to about 900° C.

In some embodiments, operations 104 and 106 are clustered together in a clustered tool. In some embodiments, operations 104 and 106 are performed without breaking vacuum between operation 104 and operation 106. In some embodiments, operation 104 and operation 106 are performed within a single processing environment.

In one or more embodiments, a method of forming an electronic device 200 comprises forming a high quality barrier layer 206 on a conformal silicon layer 204 on a surface 203 of a substrate material 202 having a three-dimensional feature formed thereon. In one or more embodiments, the barrier layer 206 comprises one or more of silicon oxide or silicon nitride and is formed by one or more of rapid thermal processing (RTP), decoupled plasma oxidation (DPO) or decoupled plasma nitridation (DPN), the high quality barrier layer 206 having a first thickness. In one or more embodiments, a second thickness of one or more of a silicon oxide layer or silicon nitride layer 208 is deposited on the high quality barrier layer 206 by atomic layer deposition (ALD). In one or more embodiments, the sum of the first thickness and the second thickness is less than or equal to about 30 Å. In one or more embodiments, the first thickness is about 10 Å to about 25 Å. In one or more embodiments, forming the high quality barrier layer 206 results in the conformal silicon layer 204 having fewer defects or improved electrical properties compared to a conformal silicon layer without a high quality barrier layer formed thereon. In one or more embodiments, about 1 Å of the conformal silicon layer is consumed for about every 2 Å of the high quality barrier layer formed.

In one or more embodiments, the RTP is performed in one or more of an oxidizing environment or a nitriding environment.

Figure 3:
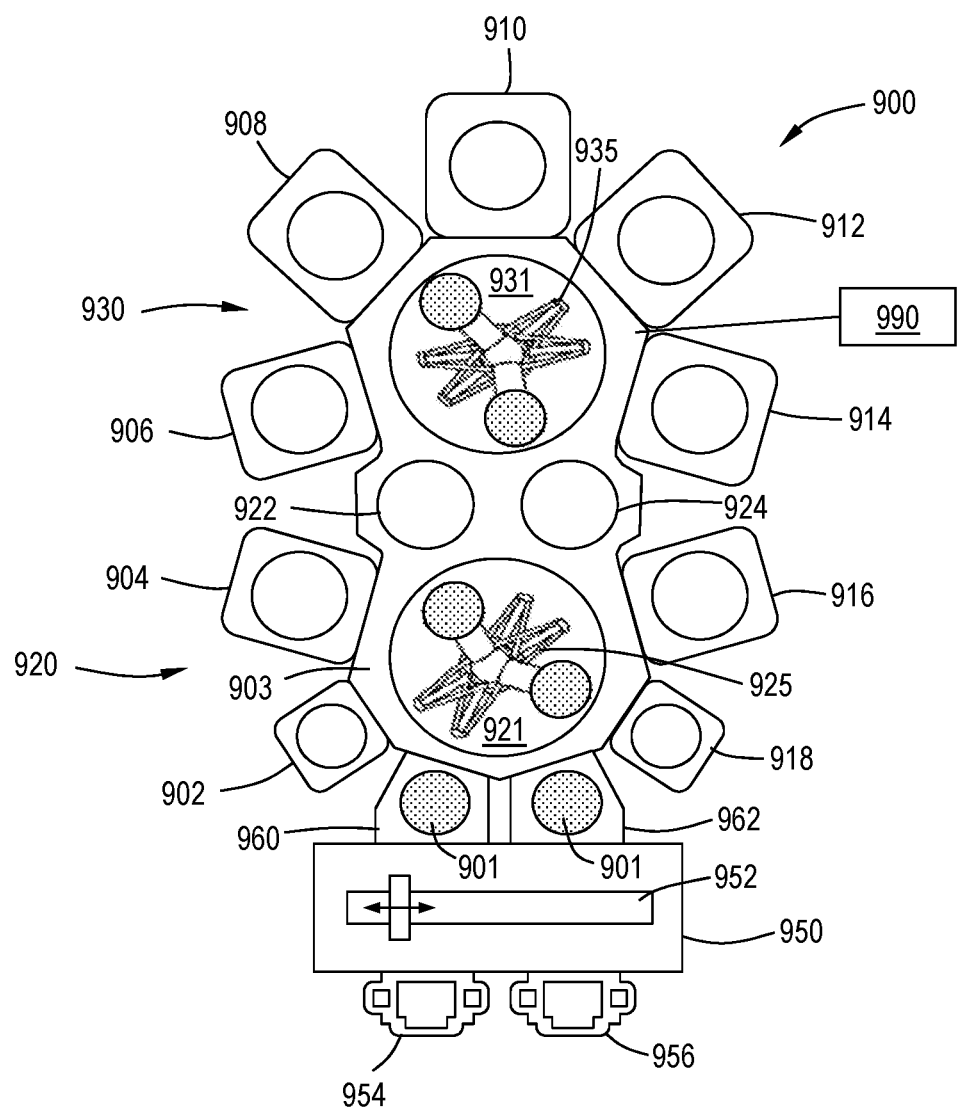
FIG. 3 illustrates a cluster tool according to one or more embodiments of the disclosure.

Additional embodiments of the disclosure are directed to processing tools 900 for the formation of the memory devices and methods described, as shown in FIG. 3.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD) chamber. The particular arrangement of process chambers and components can be varied depending on the cluster tool and should not be taken as limiting the scope of the disclosure.

In one or more embodiments, the cluster tool 900 includes a silicon oxide ($SiO_2$) chamber to deposit silicon oxide ($SiO_2$). The silicon oxide ($SiO_2$) deposition chamber of some embodiments comprises an atomic layer deposition chamber, a plasma enhanced atomic layer deposition chamber, or a spatial atomic layer deposition chamber. In one or more embodiments, the cluster tool 900 includes a pre-cleaning chamber connected to the central transfer station.

In the embodiment shown in FIG. 3, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, the processing tool 900 comprises a central transfer station 921, 931 comprising at least one robot 925, 935 configured to move a wafer; one or more of a rapid thermal processing (RTP) station, a decoupled plasma oxidation (DPO), or decoupled plasma nitridation (DPN) station connected to the central transfer station; an atomic layer deposition (ALD) station connected to the central transfer station; an optional pre-clean station connected to the central transfer station; and at least one controller connected to the one or more of the central transfer station, the RTP station, the DPO station, the DPN station, the ALD station or the optional pre-clean station. In one or more embodiments, the at least one controller has at least one configuration selected from: a configuration to move the wafer between stations using the robot; a configuration to perform a rapid thermal process; a configuration to perform a decoupled plasma process; a configuration to control a flow of an oxidizing gas into the RTP station or DPO station; a configuration to control a flow of a nitriding gas into the RTP station or DPN station; a configuration to deposit a silicon oxide film by atomic layer deposition; and a configuration to pre-clean the wafer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming an electronic device, the method comprising:
    forming a barrier layer comprising a high quality silicon oxide layer on a silicon layer, wherein about 1 Å of the silicon layer is consumed for about every 2 Å of the barrier layer formed;
    depositing a silicon oxide layer on the barrier layer, wherein a combined thickness of the barrier layer and the silicon oxide layer is less than or equal to about 25 Å, wherein the silicon oxide layer is deposited using an atomic layer deposition (ALD) process; and
    promoting the growth of the silicon oxide layer after forming the barrier layer and prior to depositing the silicon oxide layer by ALD.

2. The method of claim 1, further comprising pre-cleaning the silicon layer prior to forming the barrier layer.

3. The method of claim 1, wherein the silicon oxide layer further comprises silicon nitride.

4. The method of claim 1, wherein the silicon layer is formed on a surface of a substrate material comprising one or more of silicon (Si), germanium (Ge), gallium (Ga), arsenic (As), indium (In), phosphorus (P), copper (Cu), selenium (Se), titanium (Ti), tantalum (Ta), or tungsten (W).

5. The method of claim 4, wherein the surface has a three dimensional feature formed thereon and the silicon layer is conformal to the surface.

6. The method of claim 1, wherein the barrier layer comprises one or more of silicon oxide or silicon oxynitride.

7. The method of claim 6, wherein the barrier layer has a thickness in a range of about 10 Å to about 25 Å.

8. The method of claim 6, wherein forming the barrier layer comprises one or more of thermal oxidation, thermal nitridation, plasma oxidation, or plasma nitridation.

9. The method of claim 8, wherein forming the barrier layer results in the silicon layer having fewer defects or improved electrical properties compared to a silicon layer without a barrier layer formed thereon.

10. A method of forming an electronic device, the method comprising:
    forming a high quality barrier layer on a conformal silicon layer on a surface of a substrate material having a three-dimensional feature formed thereon, the barrier layer comprising one or more of silicon oxide or silicon nitride and being formed by one or more of rapid thermal processing (RTP), decoupled plasma oxidation or decoupled plasma nitridation, wherein about 1 Å of the conformal silicon layer is consumed for about every 2 Å of the high quality barrier layer formed, the high quality barrier layer having a first thickness;
    depositing a second thickness of one or more of a silicon oxide layer or silicon nitride layer on the high quality barrier layer by an atomic layer deposition (ALD), wherein a sum of the first thickness and the second thickness is less than or equal to about 30 Å, wherein the silicon oxide layer is deposited using ALD process; and
    promoting the growth of the silicon oxide layer after forming the barrier layer and prior to depositing the silicon oxide layer by ALD.

11. The method of claim 10, wherein RTP is performed in one or more of an oxidizing environment or a nitriding environment.

12. The method of claim 10, further comprising pre-cleaning the silicon layer prior to forming the barrier layer.

13. The method of claim 10, wherein the first thickness is about 10 Å to about 25 Å.

* * * * *